United States Patent
Dewan et al.

(10) Patent No.: US 11,668,763 B2
(45) Date of Patent: *Jun. 6, 2023

(54) IMPLEMENTATION TO DETECT FAILURE OR FAULT ON AN ANALOG INPUT PATH FOR SINGLE ANALOG INPUT FUNCTIONAL SAFETY APPLICATIONS

(71) Applicant: Infineon Technologies AG, Neubiberg (DE)

(72) Inventors: Ketan Dewan, Unterhaching (DE); Rocco Calabro, Villach (AT); Juergen Schaefer, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/739,347

(22) Filed: May 9, 2022

(65) Prior Publication Data
US 2022/0276323 A1 Sep. 1, 2022

Related U.S. Application Data

(63) Continuation of application No. 17/114,915, filed on Dec. 8, 2020, now Pat. No. 11,353,517.

(51) Int. Cl.
*G01R 31/54* (2020.01)
*H03M 1/12* (2006.01)

(52) U.S. Cl.
CPC ............ *G01R 31/54* (2020.01); *H03M 1/124* (2013.01)

(58) Field of Classification Search
CPC .............................. G01R 31/54; H03M 1/124
See application file for complete search history.

(56) References Cited

U.S. PATENT DOCUMENTS

| 11,353,517 | B1* | 6/2022 | Dewan | G01R 31/54 |
| 2009/0241014 | A1* | 9/2009 | De Mareschal | G05B 9/03 |
| | | | | 714/824 |

(Continued)

OTHER PUBLICATIONS

Blackberry/QNX; "Ultimate Guide to Functional Safety and Safety Certification"; https://blackberry.qnx.com/en/safety-certification/functional-safety/?utm_source=google&utm_medium=cpc&gclid=CjwKCAiAz4b_BRBbEiwA5XIVVppPi4oZLoOVvYY0QT0oWKXolKqm19RFrV1V7lwciga-07qwtOoDfxoCskYQAvD_BwE.

(Continued)

*Primary Examiner* — Christopher E Mahoney
(74) *Attorney, Agent, or Firm* — Eschweiler & Potashnik, LLC

(57) ABSTRACT

An analog fault detection circuit is disclosed. The analog fault detection circuit comprises an input terminal, an input circuit path coupled to the input terminal at a first end and a first sampling switch coupled to the second end of the input circuit path. The first sampling switch is configured to sample an input path voltage at the second end of the input circuit path to provide a first analog to digital converter (ADC) input voltage. The analog fault detection circuit further comprises a first ADC conversion circuit configured to convert the first ADC input voltage to a first digital ADC output; and a first broken wire detection circuit coupled between the first sampling switch and the first ADC conversion circuit, and configured to adaptively pulldown or pullup the first ADC input voltage, in order to detect a fault associated with a first analog circuit path.

20 Claims, 7 Drawing Sheets

(56) References Cited

U.S. PATENT DOCUMENTS

2018/0284178 A1 10/2018 Brychta et al.
2021/0223302 A1 7/2021 Silliman et al.

OTHER PUBLICATIONS

Norris; Chris; "Functional Safety in a Data Acquisition System"; Analog Dialogue 52-11; Nov. 2018.
Pini, Art; "Analog Fundamentals, How Sample and Hold Circuits Work and Ensure ADC Accuracy"; Digi-Key; Apr. 22, 2020.
Stuetzle, Doug; "High Speed ADC Sampling Transients"; LT Journal of Analog Information; Jan. 2014; pp. 34-38.
Non-Final Office action dated Oct. 28, 2021 for U.S. Appl. No. 17/114,915.
Notice of Allowance dated Feb. 3, 2022 for U.S. Appl. No. 17/114,915.

\* cited by examiner

IMPLEMENTATION TO DETECT FAILURE OR FAULT ON AN ANALOG INPUT PATH FOR SINGLE ANALOG INPUT FUNCTIONAL SAFETY APPLICATIONS

REFERENCE TO RELATED APPLICATION

This Application is a Continuation of U.S. application Ser. No. 17/114,915 filed Dec. 8, 2020, the contents of which are incorporated by reference in their entirety.

FIELD

The present disclosure relates to analog inputs in electronic circuits, and in particular, to a system and method to detect failure or fault on an analog input path from an analog source circuit to an analog to digital converter (ADC) in electronic circuits.

BACKGROUND

Functional safety is part of an overall safety strategy within many industries that attempts to reduce, to a tolerable level, the probability of harm coming to humans or operating equipment. The requirement for systems to be functionally safe has grown significantly in recent years. From nuclear power plants to medical devices to automotive systems, an errorless system has become an ideal for some and a necessity for others. For example, in the sensing world, acquiring incorrect or corrupted data can be devastating and potentially lethal depending on the system and the level of risk involved. Similarly, as automotive manufacturers race to relieve drivers of the mundanity of their daily commutes with the arrival of self-driving and autonomous vehicles, the role of functional safety in the electronics that enable this fascinating future is larger and more critical than ever.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
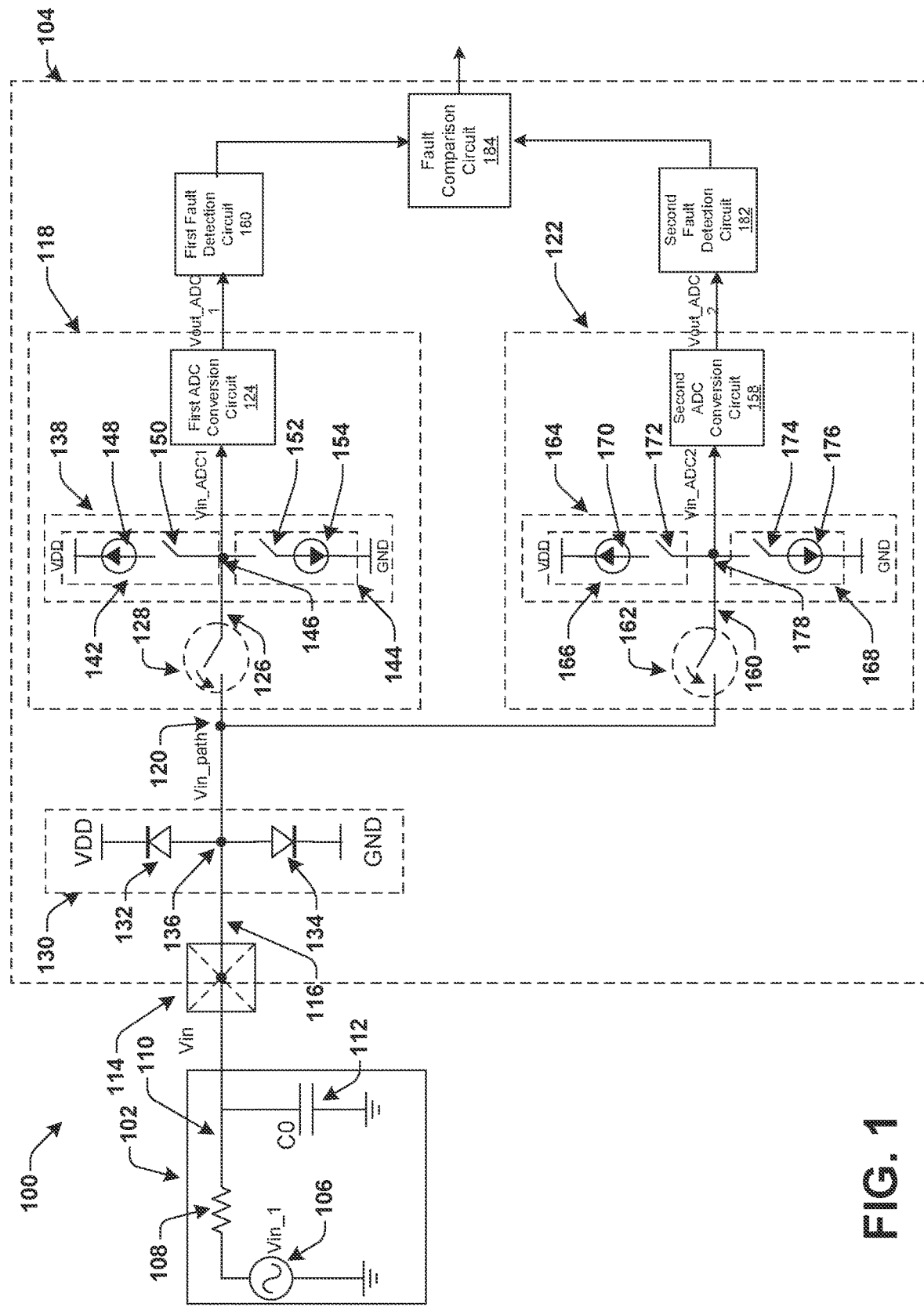
FIG. 1 illustrates a simplified block diagram of an analog fault detection system, according to one embodiment of the disclosure.

In one embodiment of the disclosure, an analog fault detection circuit is disclosed. The analog fault detection circuit comprises an input terminal configured to couple to an analog source circuit and an input circuit path having a first end and a second end, and coupled to the input terminal at the first end. The analog fault detection circuit further comprises a first analog to digital converter (ADC) circuit comprising a first ADC conversion circuit configured to convert a first ADC input voltage to a first digital ADC output, and a first ADC circuit path coupled between the second end of the input circuit path and the first ADC conversion circuit. The first ADC circuit path comprises a first sampling switch, a first terminal of which is coupled to the second end of the input circuit path. In some embodiments, the first sampling switch is configured to sample an input path voltage at the second end of the input circuit path to provide the first ADC input voltage at a second terminal of the first sampling switch. The first ADC circuit further comprises a first broken wire detection circuit coupled between the first sampling switch and the first ADC conversion circuit, and configured to adaptively pulldown or pullup the first ADC input voltage, in order to detect a fault associated with a first analog circuit path. In some embodiments, the first analog circuit path includes the analog source circuit, the input circuit path and the first ADC circuit path.

In one embodiment of the disclosure, an analog fault detection system is disclosed. The analog fault detection system comprises an analog source circuit and an analog fault detection circuit. The analog fault detection circuit comprises an input terminal configured to couple to an analog source circuit and an input circuit path having a first end and a second end, and coupled to the input terminal at the first end. The analog fault detection circuit further comprises a first analog to digital converter (ADC) circuit comprising a first ADC conversion circuit configured to convert a first ADC input voltage to a first digital ADC output, and a first ADC circuit path coupled between the second end of the input circuit path and the first ADC conversion circuit. The first ADC circuit path comprises a first sampling switch, a first terminal of which is coupled to the second end of the input circuit path. In some embodiments, the first sampling switch is configured to sample an input path voltage at the second end of the input circuit path to provide the first ADC input voltage at a second terminal of the first sampling switch. The first ADC circuit further comprises a first broken wire detection circuit coupled between the first sampling switch and the first ADC conversion circuit, and configured to adaptively pulldown or pullup the first ADC input voltage, in order to detect a fault associated with a first analog circuit path. In some embodiments, the first analog circuit path includes the analog source circuit, the input circuit path and the first ADC circuit path.

In one embodiment of the disclosure, a method for an analog fault detection circuit is disclosed. The method comprises coupling an input terminal associated with the analog fault detection circuit to an analog source circuit and converting a first analog to digital converter (ADC) input voltage to a first digital ADC output using a first ADC conversion circuit. The method further comprises sampling an input path voltage at a second end of an input circuit path using a first sampling switch, to form the first ADC input voltage. In some embodiments, a first end of the input circuit path is coupled to the input terminal and the second end of the input circuit path is coupled to the first sampling switch. In some embodiments, the first sampling switch is comprised in a first ADC circuit path coupled between the second end of the input circuit path and the first ADC conversion circuit. In some embodiments, the method further comprises adaptively pulling up or pulling down the first ADC input voltage using a first broken wire detection circuit coupled between the first sampling switch and the first ADC conversion circuit, in order to detect a fault associated with a first analog circuit path. In some embodiments, the first analog circuit path includes the analog source circuit, the input circuit path and the first ADC circuit path.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit", "module" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, the role of functional safety in electronics is larger and more critical than ever. ISO 31262 is a functional safety standard used in automotive industry. The aim of this standard is to reduce possible hazards caused by the failure and malfunction of electric and/or electronic systems in automobiles. The safety requirements for the development process depend on the automotive safety integrity level (ASIL) rating of the target application and can range from ASIL-A to ASIL-D. Applications such as steering or braking systems are rated with the highest ASIL-D level. A failure in such a system can lead to an out-of-control vehicle, possibly resulting in fatal injuries. In contemporary safety applications there are many analog inputs which require to meet ASIL Level as defined by ISO31262. Although in many applications a source of an analog input is ASIL A/B, a signal distribution path from the source to the analog to digital converter (ADC) is either not protected or require additional system level safety mechanism to cover against failure modes. However, for functional safety (especially for single analog input functional safety applications), it is essential to detect failure or fault on the signal distribution path from the source to the analog to digital converter (ADC). In some embodiments, the signal distribution path from the source to the ADC is further referred to as an analog signal path.

In order to achieve ASIL level or functional safety for the analog signal path, in some current implementations, redundant sources are utilized. In particular, a first source is coupled to a first path (e.g., a mission channel) and a second source is coupled to a second path (e.g., a monitoring channel). A fault in the path of the first source or the second source could be detected by plausibility check against the results of the diverse redundant channels. In some embodiments, the first source and the second source comprise homogenous sources. Alternately, in other embodiments, the first source and the second source comprise heterogeneous sources. In some embodiments, both the first source and the second source comprise analog sources. In such embodiments, a fault in the path of the first source or the second source are determined based on comparing results of ADCs coupled to the first path and the second path, respectively. Alternately, in other embodiments, the first source may comprise an analog input and the second source may be a digital input. Utilizing redundant sources for functional safety, however, increases area and power consumption in electronic circuits with analog inputs. Further, utilizing redundant sources limits the number of analog inputs that could be supported in electronic circuits.

Alternately, in some current implementations, in order to achieve ASIL level or functional safety for the analog signal path, a same analog input (e.g., an analog source circuit) is connected to at least two ADC channels, each ADC channel comprising a corresponding ADC. Each ADC channel further comprises a fault identification circuit coupled between the analog input and a sampling switch associated with the respective ADC. The fault identification circuit is configured to adaptively pull up or pull down an input voltage to the sampling switch (or a voltage at the input of the sampling switch), in order to detect the fault in the analog signal path coupled between the analog input and the corresponding ADC. In some embodiments, a defect in each ADC channel is determined based on a digital ADC output of the respective channel. In particular, the defect in each ADC channel is determined based on a difference in a first digital ADC output immediately after pull up or pulldown is deactivated and a second digital ADC output after a predefined time after the pullup or pulldown is deactivated.

For example, if the input voltage to the sampling switch is pulled down and if there is a no fault in the analog input path, the second ADC output will go back to the analog input voltage (provided by the analog source), as the analog source is connected to the sampling switch. However, if the input voltage to the sampling switch is pulled down and if there is a fault in the analog input path, the second ADC output will remain low, as the analog source is partially or fully disconnected from the input of the ADC, thereby enabling to detect the fault. However, coupling the fault identification circuit between the analog input and the sampling switch results in leakage, which affects the voltage on capacitors (e.g., the capacitors may be charged or discharged) coupled to the analog signal path (between the analog input and the fault identification circuit). Therefore, in such embodiments, even when there is a fault in the analog signal path, the second ADC output will go high, due to the leakage charge from the capacitors. This results in unreliable fault detection. In order to overcome the above disadvantages, disclosed herein are systems and methods to reliably detect fault or failure in the analog signal path, based on utilizing a single analog input and with reduced leakage.

FIG. 1 illustrates a simplified block diagram of an analog fault detection system 100, according to one embodiment of the disclosure. In some embodiments, the analog fault detection system 100 comprises a part of electronic systems/circuits that receive analog inputs (e.g., coupled to analog input sources). In some embodiments, the analog fault detection system 100 facilitates to detect fault or failure associated with an analog signal/circuit path that couples an analog source circuit to an analog to digital converter (ADC) in electronic circuits. In addition, in some embodiments, the analog fault detection system 100 facilitates to detect fault or failure associated with the analog source circuit that is coupled to the electronic circuits. The analog fault detection system 100 comprises an analog source circuit 102 and an analog fault detection circuit 104. In some embodiments, the analog fault detection circuit 104 may be implemented on a single integrated chip (IC). Alternately, in other embodiments, the analog fault detection circuit 104 may be implemented on one or more integrated chips (ICs).

The analog source circuit 102 comprises an input source circuit 106 configured to provide an analog input voltage Vin_1. In some embodiments, the analog source circuit 102 further comprises a source circuit path 110 configured to couple the input source circuit 106 to the analog fault detection circuit 104. In some embodiments, the source circuit path 110 comprises an input resistance 108 and an input capacitor C0 112. Alternately, in other embodiments, the source circuit path 110 may include only a conductive trace and may not include any other components. The analog fault detection circuit 104 is configured to couple to the analog source circuit 102, in order to receive an analog input voltage Vin. In some embodiments, the analog input voltage Vin is same as the analog input voltage Vin_1. Alternately, in other embodiments, the analog input voltage Vin may be slightly different from the analog input voltage Vin_1, due to a drop in the source circuit path 110. The analog fault detection circuit 104 is configured to couple to the analog source circuit 102 via an input terminal 114. In some embodiments, the input terminal 114 is coupled to the source circuit path 110, in order to couple to the analog source circuit 102.

The analog fault detection circuit 104 further comprises an input circuit path 116, a first analog to digital converter (ADC) circuit 118 and a second ADC circuit 122. The input circuit path 116 comprises a first end and a second end, the first end being coupled to the input terminal 114 and the second end being coupled to a common electrical node 120. In some embodiments, the second end of the input circuit path 116 coincides with the common electrical node 120. In some embodiments, the first input circuit path 116 comprises an electrostatic discharge (ESD) protection device 130 coupled to an ESD node 136 associated therewith. In some embodiments, the ESD protection device 130 comprises a first diode 132 coupled between the ESD node 136 and a positive voltage VDD. In addition, the ESD protection device 130 comprises a second diode 134 coupled between the ESD node 136 and a ground GND. Other implementations of the ESD protection device 130 are also contemplated to be within the scope of this disclosure. In some embodiments, the input circuit path 116 may further comprise other components (e.g., resistors, capacitors etc.) coupled therewith. Alternately, in other embodiments, the input circuit path 116 may comprise a conductive trace without any components coupled thereto.

The first ADC circuit 118 and the second ADC circuit 122 are coupled to the second end of the input circuit path 116 via the common electrical node 120. The first ADC circuit 118 comprises a first ADC conversion circuit 124 and a first ADC circuit path 126 that is coupled between the second end of the input circuit path 116 (or the common electrical node 120) and the first ADC conversion circuit 124. The first ADC circuit path 126 comprises a conductive path and may include one or more components coupled thereto. The first ADC circuit path 126 comprises a first sampling switch 128 having a first terminal and a second terminal, the first terminal being coupled to the second end of the input circuit path 116 or the common electrical node 120 and the second terminal being coupled to the first ADC conversion circuit 124 (via the first ADC circuit path 126). In some embodiments, the first sampling switch 128 may be implemented using one or more metal oxide semiconductor field effect transistors (MOSFETs), bipolar junction transistors (BJTs) etc. The first sampling switch 128 is configured to sample an input path voltage Vin_path at the second end of the input circuit path 116 to provide a first ADC input voltage Vin_ADC1 at the second terminal of the first sampling switch 128. In some embodiments, the input path voltage Vin_path may be same as the analog input voltage Vin. Alternately, in other embodiments, the input path voltage Vin_path may be different from the analog input voltage Vin, due to some voltage drop in the input circuit path 116. In some embodiments, the first ADC input voltage Vin_ADC1 comprises a sampled version of the input path voltage Vin_path (which is an analog voltage). In some embodiments, the first ADC conversion circuit 124 is configured to convert the first ADC input voltage Vin_ADC1 to a first digital ADC output Vout_ADC1.

In some embodiments, the first ADC circuit 118 further comprises a first broken wire detection circuit 138 coupled between the first sampling switch 128 and the first ADC conversion circuit 124, and configured to adaptively pulldown or pullup the first ADC input voltage Vin_ADC1, in order to detect a fault associated with a first analog circuit path. In some embodiments, the first analog circuit path includes the analog source circuit 102 (that includes the input source circuit 106 and the source circuit path 110), the input circuit path 116 and the first ADC circuit path 126. In some embodiments, the first broken wire detection circuit 138 comprises a first pullup circuit branch 142 configured to pullup the first ADC input voltage Vin_ADC1 to a positive voltage VDD.

The first pullup circuit branch 142 comprises a first pullup source circuit 148 and a first pullup switch circuit 150. In some embodiments, the first pullup switch circuit 150 may be implemented using one or more metal oxide semiconductor field effect transistors (MOSFETs), bipolar junction transistors (BJTs) etc. The first pullup source circuit 148 is coupled to a positive supply voltage VDD at a first end, and to the first pullup switch circuit 150 at a second, different end. The first pullup switch circuit 150 comprises a first terminal and a second terminal, the first terminal being coupled in series to the second end of the first pullup source circuit 148 and the second terminal being coupled to an ADC node 146 in the first ADC circuit path 126 coupled between the first sampling switch 128 and the first ADC conversion circuit 124. In some embodiments, the first pullup source circuit 148 comprises a current source. Alternately, in other embodiments, the first pullup source circuit 148 may comprise a voltage source.

In some embodiments, the first broken wire detection circuit 138 further comprises a first pulldown circuit branch 144 configured to pulldown the first ADC input voltage Vin_ADC1 to ground. The first pulldown circuit branch 144 comprises a first pulldown source circuit 154 and a first pulldown switch circuit 152. In some embodiments, the first pulldown switch circuit 152 may be implemented using one or more metal oxide semiconductor field effect transistors (MOSFETs), bipolar junction transistors (BJTs) etc. The first pulldown source circuit 154 is coupled to a ground voltage GND at a first end, and to the first pulldown switch circuit 152 at a second, different end. The first pulldown switch circuit 152 comprises a first terminal and a second terminal, the first terminal being coupled in series to the second end of the first pulldown source circuit 154 and the second terminal being coupled to the ADC node 146 in the first ADC circuit path 126 coupled between the first sampling switch 128 and the first ADC conversion circuit 124.

In some embodiments, the first pulldown source circuit 154 comprises a current source. Alternately, in other embodiments, the first pulldown source circuit 154 may comprise a voltage source. In this embodiment, the broken wire detection circuit 138 is shown to include both the first pullup circuit branch 142 and the first pulldown circuit branch 144. Alternately, in other embodiments, the broken wire detection circuit 138 may include the first pullup circuit branch 142 only or the first pulldown circuit branch 144 only. In some embodiments, coupling the first broken wire detection circuit 138 between the first sampling switch 128 and the first ADC conversion circuit 124 enables to reduce leakage from the first broken wire detection circuit 138 to the analog source circuit 102 (due to the first sampling switch 128 being open at half of the time instances during sampling). Further, utilizing the first pullup source circuit 148 and the first pulldown source circuit 154 provides a controlled current flow through the first pullup circuit branch 142 and the first pulldown circuit branch 144, which further reduces the leakage to the analog source circuit 102.

The second ADC circuit 122 comprises a second ADC conversion circuit 158 and a second ADC circuit path 160 that is coupled between the second end of the input circuit path 116 (or the common electrical node 120) and the second ADC conversion circuit 158. The second ADC circuit path 160 comprises a conductive path and may include one or more components coupled thereto. In particular, the second ADC circuit path 160 comprises a second sampling switch 162 having a first terminal and a second terminal, the first terminal being coupled to the second end of the input circuit path 116 or the common electrical node 120 and the second terminal being coupled to the second ADC conversion circuit 158 (via the second ADC circuit path 160). The second sampling switch 162 is configured to sample the input path voltage Vin_path at the second end of the input circuit path 116 to provide a second ADC input voltage Vin_ADC2 at the second terminal of the second sampling switch 162. In some embodiments, the second ADC input voltage Vin_ADC2 comprises a sampled version of the input path voltage Vin_path (which is an analog voltage). In some embodiments, the second ADC conversion circuit 158 is configured to convert the second ADC input voltage Vin_ADC2 to a second digital ADC output Vout_ADC2.

In some embodiments, the second ADC circuit 122 further comprises a second broken wire detection circuit 164 coupled between the second sampling switch 162 and the second ADC conversion circuit 158, and configured to adaptively pulldown or pullup the second ADC input voltage Vin_ADC2, in order to detect a fault associated with a second analog circuit path. In some embodiments, the second analog circuit path includes the analog source circuit 102 (that includes the input source circuit 106 and the source circuit path 110), the input circuit path 116 and the second ADC circuit path 160. In some embodiments, the second broken wire detection circuit 164 comprises a second pullup circuit branch 166 configured to pullup the second ADC input voltage Vin_ADC2 to a positive voltage VDD.

The second pullup circuit branch 166 comprises a second pullup source circuit 170 and a second pullup switch circuit 172. In some embodiments, the second pullup switch circuit 172 may be implemented using one or more metal oxide semiconductor field effect transistors (MOSFETs), bipolar junction transistors (BJTs) etc. The second pullup source circuit 170 is coupled to a positive supply voltage VDD at a first end, and to the second pullup switch circuit 172 at a second, different end. The second pullup switch circuit 172 comprises a first terminal and a second terminal, the first terminal being coupled in series to the second end of the second pullup source circuit 170 and the second terminal being coupled to an ADC node 178 in the second ADC circuit path 160 coupled between the second sampling switch 162 and the second ADC conversion circuit 158. In some embodiments, the second pullup source circuit 170 comprises a current source. Alternately, in other embodiments, the second pullup source circuit 170 may comprise a voltage source.

In some embodiments, the second broken wire detection circuit 164 further comprises a second pulldown circuit branch 168 configured to pulldown the second ADC input voltage Vin_ADC2 to ground. The second pulldown circuit branch 168 comprises a second pulldown source circuit 176 and a second pulldown switch circuit 174. In some embodiments, the second pulldown switch circuit 174 may be implemented using one or more metal oxide semiconductor field effect transistors (MOSFETs), bipolar junction transistors (BJTs) etc. The second pulldown source circuit 176 is coupled to a ground voltage GND at a first end, and to the second pulldown switch circuit 174 at a second, different end. The second pulldown switch circuit 174 comprises a first terminal and a second terminal, the first terminal being coupled in series to the second end of the second pulldown source circuit 176 and the second terminal being coupled to the ADC node 178 in the second ADC circuit path 160 coupled between the second sampling switch 162 and the second ADC conversion circuit 158.

In some embodiments, the second pulldown source circuit 176 comprises a current source. Alternately, in other embodiments, the second pulldown source circuit 176 may comprise a voltage source. In this embodiment, the second broken wire detection circuit 164 is shown to include both the second pullup circuit branch 166 and the second pulldown circuit branch 168. Alternately, in other embodiments, the second broken wire detection circuit 164 may include the second pullup circuit branch 166 only or the second pulldown circuit branch 168 only. In some embodiments, coupling the second broken wire detection circuit 164 between the second sampling switch 162 and the second ADC conversion circuit 158 enables to reduce leakage from the second broken wire detection circuit 164 to the analog source circuit 102 (due to the second sampling switch 162 being open at half of the time instances during sampling). Further, utilizing the second pullup source circuit 170 and the second pulldown source circuit 172 provides a controlled current flow through the second pullup circuit branch 166 and the second pulldown circuit branch 168, which further reduces the leakage to the analog source circuit 102.

In some embodiments, when the first broken wire detection circuit 138 comprises the first pullup branch 142 only, the second broken wire detection circuit 164 also comprises the second pullup branch 166 only. Similarly, in some embodiments, when the first broken wire detection circuit 138 comprises the first pulldown branch 144 only, the second broken wire detection circuit 164 also comprises the second pulldown branch 168 only. However, other configurations of the first broken wire detection circuit 138 and the second broken wire detection circuit 164 are also possible, for example, the first broken wire detection circuit 138 comprising the first pullup branch 142 only and the second broken wire detection circuit 164 comprising the second pulldown branch 168 only, and vice versa. Further, when the first broken wire detection circuit 138 comprises both pullup and pulldown branches, the second broken wire detection circuit 164 also comprises both pullup and pulldown branches. In the embodiments, where the first broken wire detection circuit 138 and the second broken wire detection circuit 164 comprise both pullup and pulldown branches, for fault detection, either the pullup branches of both the first broken wire detection circuit 138 and the second broken wire detection circuit 164 are activated/deactivated, or the pulldown branches of both the first broken wire detection circuit 138 and the second broken wire detection circuit 164 are activated/deactivated. However, in other embodiments, the first broken wire detection circuit 138 and the second broken wire detection circuit 164 may be activated/deactivated differently.

In some embodiments, the analog fault detection circuit 104 further comprises a first fault detection circuit 180 coupled to an output of the first ADC conversion circuit 124 and configured to detect the fault in the first analog circuit path, based on the first digital ADC output Vout_ADC1. In some embodiments, the first analog circuit path includes the analog source circuit 102 (that includes the input source circuit 106 and the source circuit path 110), the input circuit path 116 and the first ADC circuit path 126, as explained above. Further, in some embodiments, the analog fault detection circuit 104 comprises a second fault detection circuit 182 coupled to an output of the second ADC conversion circuit 158 and configured to detect the fault in the second analog circuit path, based on the second digital ADC output Vout_ADC2. In some embodiments, the second analog circuit path includes the analog source circuit 102 (that includes the input source circuit 106 and the source circuit path 110), the input circuit path 116 and the second ADC circuit path 160, as explained above. In some embodiments, the analog fault detection circuit 104 further comprises a fault comparison circuit 184 configured to compare results of the first fault detection circuit 180 and the second fault detection circuit 182. In some embodiments, the fault comparison circuit 184 is further configured to provide an indication of a fault, based on the comparison.

For example, when a fault is identified by both the first fault detection circuit 180 and the second fault detection circuit 182, the fault comparison circuit 184 may provide an indication that a fault is identified, for example by activating an alarm or providing an error message. In some embodiments, when the fault is identified by both the first fault detection circuit 180 and the second fault detection circuit 182, it may be indicative of a fault associated with the analog source circuit 102 or the input circuit path 116 (both of which are common to the first fault detection circuit 180 and the second fault detection circuit 182). Further, when no fault is identified by both the first fault detection circuit 180 and the second fault detection circuit 182, the fault comparison circuit 184 may provide a message indicating that there is no error. Furthermore, when a fault is identified by only one of the first fault detection circuit 180 and the second fault detection circuit 182, the fault comparison circuit 184 may further provide an error message or an alarm. In some embodiments, when the fault is identified by only one of the first fault detection circuit 180 and the second fault detection circuit 182, it may be indicative of a fault associated with the first ADC circuit path 126 or the second ADC circuit path 160. Therefore, in such embodiments, the error message from the fault comparison circuit may indicate that the fault is associated with an ADC circuit path. In such embodiments, the corresponding ADC may be reset for correcting the fault. In this embodiment, the analog fault detection circuit 104 is shown to include a first ADC circuit 118 and a second ADC circuit 122 coupled to the second end of the input circuit path 116. However, in other embodiments, more than two ADC circuits may be coupled to the second end of the input circuit path 116. Further, in some alternate embodiments, only one ADC circuit (e.g., the first ADC circuit 118) may be coupled to the second end of the input circuit path 116. In such embodiments, however, the fault comparison circuit 184 may not be included. Rather, in such embodiments, the fault associated with the analog circuit path is detected by the corresponding fault detection circuit based on the corresponding digital ADC output, and an alarm/indication may be generated based thereon.

Figure 2:
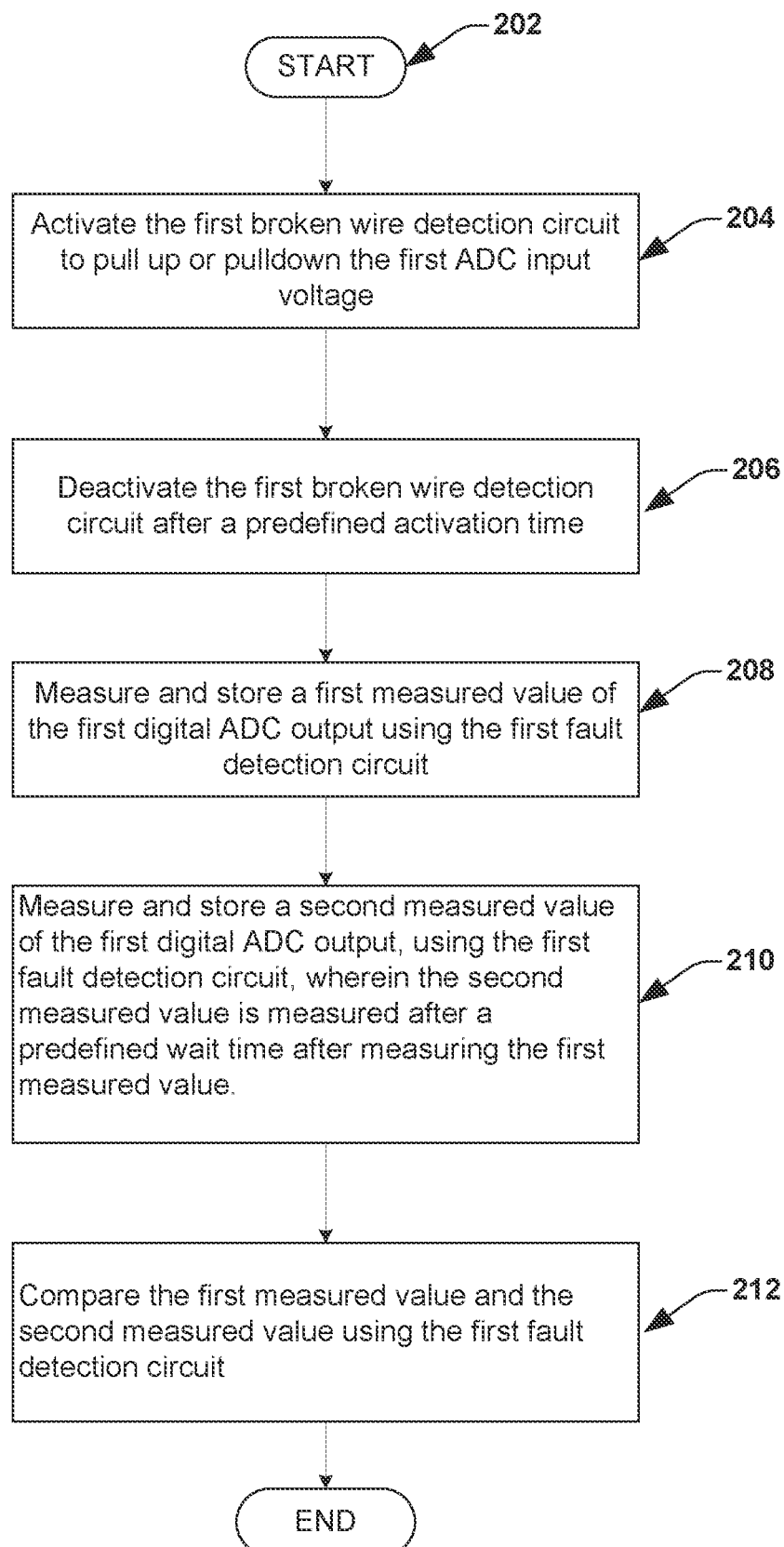
FIG. 2 illustrates a flowchart of an algorithm utilized by the analog fault detection circuit, in order to detect the fault in the first analog circuit path or the second analog circuit path.

FIG. 2 illustrates a flowchart of an algorithm 200 utilized by the analog fault detection circuit 104, in order to detect the fault in the first analog circuit path or the second analog circuit path. The algorithm 200 may be implemented using the first broken wire detection circuit 138 and the first fault detection circuit 180, in order to determine a fault associated with the first analog circuit path. Similarly, the algorithm 200 may be implemented using the second broken wire detection circuit 164 and the second fault detection circuit 182, in order to determine a fault associated with the second analog circuit path. The algorithm 200 is explained herein with reference to the first broken wire detection circuit 138 and the first fault detection circuit 180 of the analog fault detection circuit 104. However, the algorithm 200 is equally applicable to the second broken wire detection circuit 164 and the second fault detection circuit 182, and is not to be construed to be limited.

In some embodiments, the algorithm 200 is implemented at predefined time intervals (e.g., once every driving cycle) to cover permanent as well as random faults. In some embodiments, algorithm 200 is implemented using the first broken wire detection circuit 138 and the first fault detection circuit 180, and the algorithm 200 is implemented using the second broken wire detection circuit 164 and the second fault detection circuit 182, simultaneously. Alternately, in other embodiments, algorithm 200 is implemented using the first broken wire detection circuit 138 and the first fault detection circuit 180, and the algorithm 200 is implemented using the second broken wire detection circuit 164 and the second fault detection circuit 182, at different time instances. Referring to FIG. 2, at 202, the algorithm 200 starts. At 204, the first broken wire detection circuit 138 is activated to pullup or pulldown the first ADC input voltage Vin_ADC1. Specifically, the first pullup circuit branch 142 is activated/enabled to pullup the first ADC input voltage Vin_ADC1 to VDD and the first pulldown circuit branch 144 is configured to pulldown the first ADC input voltage Vin_ADC1 to GND. In some embodiments, activating/enabling the first pullup circuit branch 142 comprises turning ON the first pullup switch circuit 150 and activating/enabling the first pulldown circuit branch 144 comprises turning ON the first pulldown switch circuit 152.

At 206, the first broken wire detection circuit 138 is deactivated/disabled after a predefined activation time. Specifically, the first pullup circuit branch 142 or the first pulldown circuit branch 144 that was activated/enabled at 204 is deactivated/disabled. In some embodiments, deactivating/disabling the first pullup circuit branch 142 comprises turning OFF the first pullup switch circuit 150 and deactivating/disabling the first pulldown circuit branch 144 comprises turning OFF the first pulldown switch circuit 152. At 208, a first measured value of the first digital ADC output Vout_ADC1, after the deactivation of the first broken wire detection circuit 138, is measured and stored using the first fault detection circuit 180. In some embodiments, the first measured value is measured after a predefined deactivation time after the deactivation of the first broken wire detection circuit 138. At 210, a second measured value of the first digital ADC output Vout_ADC1, after the deactivation of the first broken wire detection circuit 138, is measured and stored using the first fault detection circuit 180. In some embodiments, the second measured value comprises a value of the first digital ADC output Vout_ADC1 that is measured after a predefined wait time after measuring the first measured value. At 212, the first measured value and the second measured value are compared using the first fault detection circuit 180, in order to detect the fault in the first analog circuit path.

Figure 3A:
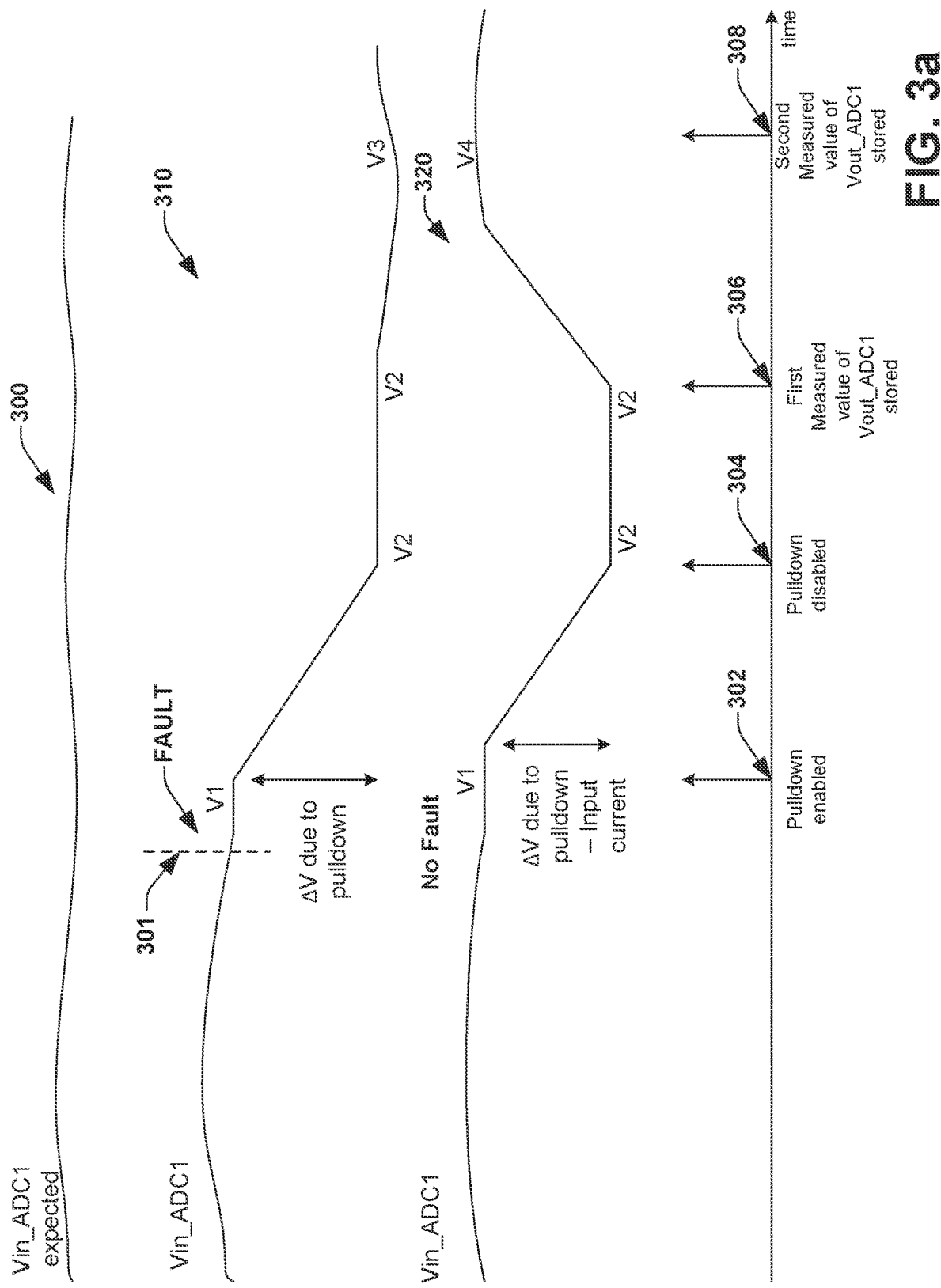
FIG. 3a illustrates one possible embodiment of a variation in the first ADC input voltage Vin_ADC1 in time, while implementing the algorithm to detect the fault in the first analog circuit path.

In some embodiments, when there is no fault in the analog circuit path, there will be a sufficient deviation (e.g., in a predefined deviation range) between the first measured value and the second measured value. However, if there is a fault in the analog circuit path, the first measured value and the second measured value will show similar values (within a predefined expected range), further details of which are provided in embodiments below. Therefore, in some embodiments, the first fault detection circuit 180 identifies a fault in the first analog circuit path, when the first measured value and the second measured value shows similar values. FIG. 3a illustrates one possible embodiment of a variation in the first ADC input voltage Vin_ADC1 in time, while implementing the algorithm 200 to detect the fault in the first analog circuit path. In particular, FIG. 3a illustrates waveforms of the first ADC input voltage Vin_ADC1 for an embodiment where the first analog circuit path is broken or intermittent broken. In this embodiment, the algorithm 200 is implemented by pulling down the Vin_ADC1 using the first broken wire detection circuit 138. However, in other embodiments, the algorithm 200 may be implemented by pulling up the Vin_ADC1 using the first broken wire detection circuit 138. Waveforms associated with the second ADC input voltage Vin_ADC2 also exhibit similar variation when implementing the algorithm 200 to detect a similar fault in the second analog circuit path, and is therefore not repeated herein.

Waveform 300 depicts an expected variation of the Vin_ADC1 in time, during regular operation (i.e., when the algorithm 200 is not implemented) and when there is no fault in the first analog circuit path. Further, waveform 310 depicts a variation of the Vin_ADC1 in time while implementing the algorithm 200 and when a fault occurs at 301 (time instance) in the first analog circuit path (i.e., the first analog circuit path is broken or intermittent broken). Furthermore, waveform 320 depicts a variation of the Vin_ADC1 in time while implementing the algorithm 200 and when no fault occurs in the first analog circuit path. At 302, pulldown is enabled using the first broken wire detection circuit 138. As can be seen from FIG. 3a, both the waveforms 310 and 320 show a decrease in voltage from V1 to V2 after the pulldown is enabled. After a predefined activation time, the pulldown is disabled at 304. As can be seen from waveforms 310 and 320, Vin_ADC1 settles at the lower voltage V2 after 304.

At 306, a first measured value of Vin_ADC1 is stored. Specifically, the first measured value of Vin_ADC1 is measured/stored after a predefined deactivation time after 304. As can be seen from FIG. 3a, both the waveforms 310 and 320 have a voltage V2 at 306. At 308, a second measured value of Vin_ADC1 is stored. The second measured value is measured/stored after a predefined wait time after measuring the first measured value. If there is no fault in the first analog circuit path, the Vin_ADC1 will go back to the previous level (i.e., V1) before the pulldown was enabled. However, as can be seen from FIG. 3a, the waveform 310 shows a voltage of V3 at 308 which is very close to the pulldown voltage V2. In other words, because of the fault, the Vin_ADC1 does not go back to the previous level of voltage (i.e., V1) before the pulldown was enabled. Whereas, the waveform 320 shows a voltage of V4 at 308 which is very close to the previous level of voltage (i.e., V1) before the pulldown was enabled. Therefore, when the first measured value and the second measured value show similar values, the first fault detection circuit 180 detects a fault in the first analog circuit path. In contrast, when the first measured value and the second measured value shows sufficient deviation (e.g., in a predefined range), the first fault detection circuit 180 identifies that there is no fault in the analog circuit path.

Figure 3B:
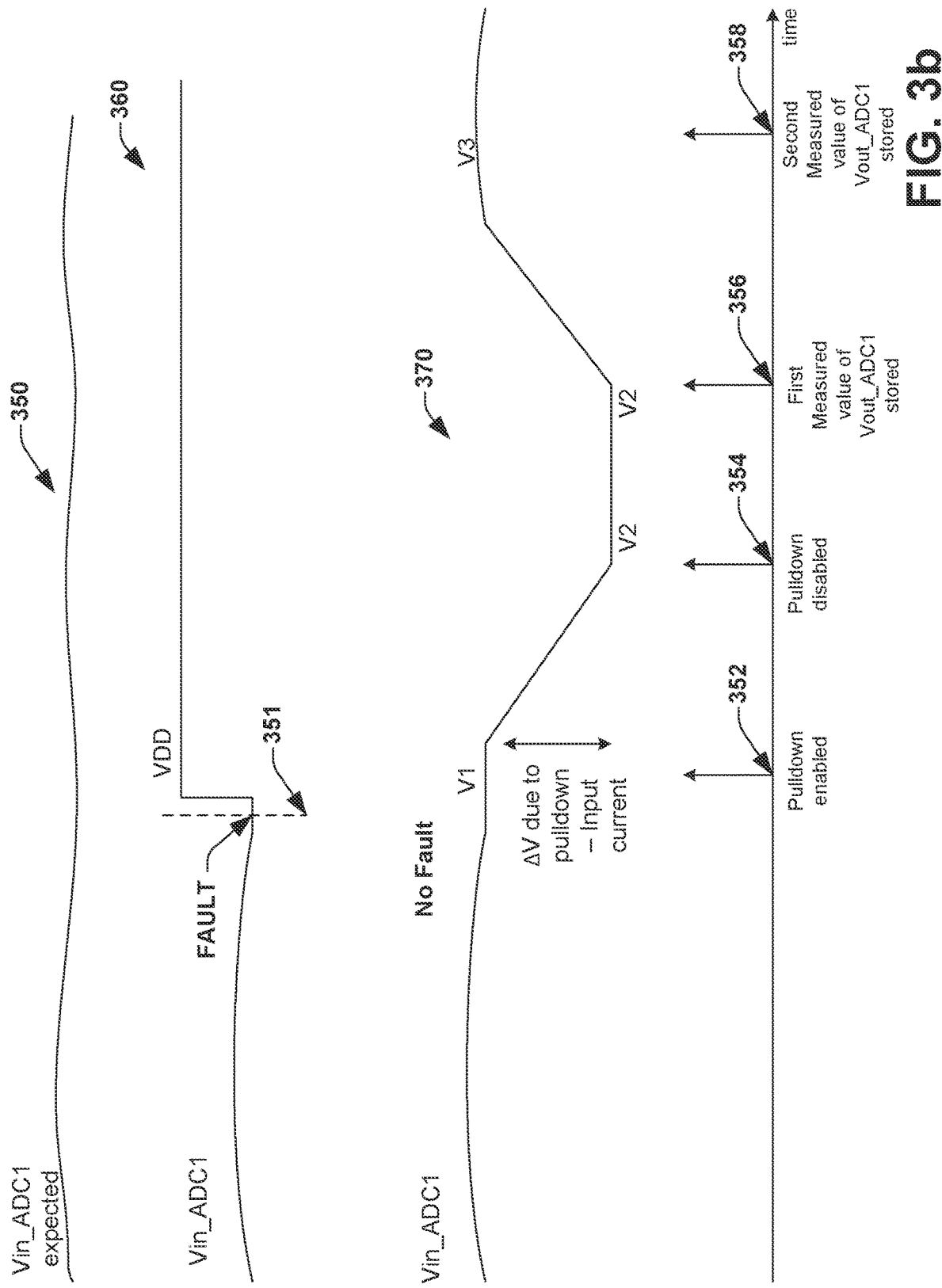
FIG. 3b illustrates another possible embodiment of a variation in the first ADC input voltage Vin_ADC1 in time, while implementing the algorithm to detect the fault in the first analog circuit path.

FIG. 3b illustrates another possible embodiment of a variation in the first ADC input voltage Vin_ADC1 in time, while implementing the algorithm 200 to detect the fault in the first analog circuit path. In particular, FIG. 3b illustrates waveforms of the first ADC input voltage Vin_ADC1 for an embodiment where the input source circuit 106 is shorted to VDD. In other words, the fault in the first analog circuit path comprises the input source circuit 106 being shorted to VDD. Alternately, in other embodiments, the fault may comprise the input source circuit 106 being shorted to GND.

In this embodiment, the algorithm 200 is implemented by pulling down the Vin_ADC1 using the first broken wire detection circuit 138. However, in other embodiments, the algorithm 200 may be implemented by pulling up the Vin_ADC1 using the first broken wire detection circuit 138. Waveforms associated with the second ADC input voltage Vin_ADC2 also exhibit similar variation when implementing the algorithm 200 to detect a similar fault in the second analog circuit path, and is therefore not repeated herein.

Waveform 350 depicts an expected variation of the Vin_ADC1 in time, during regular operation (i.e., when the algorithm 200 is not implemented) and when there is no fault in the first analog circuit path. Further, waveform 360 depicts a variation of the Vin_ADC1 in time while implementing the algorithm 200 and when a fault occurs at 351 (time instance) in the first analog circuit path (i.e., the input source circuit 106 is shorted to VDD). Furthermore, waveform 370 depicts a variation of the Vin_ADC1 in time while implementing the algorithm 200 and when no fault occurs in the first analog circuit path. At 352, pulldown is enabled using the first broken wire detection circuit 138. As can be seen from FIG. 3b, because of the fault at 351 (i.e., the input source circuit 106 being shorted to VDD), the waveform 360 stays at VDD even with pulldown enable, as the short current is much greater than the pulldown current. The waveform 370, however, shows a decrease in voltage from V1 to V2 after the pulldown is enabled, since there is no fault. After a predefined activation time, the pulldown is disabled at 354. Because of the fault, the waveform 360 remains at VDD. Whereas, the waveform 370, Vin_ADC1 settles at the lower voltage V2 after 354.

At 356, a first measured value of Vin_ADC1 is stored. Specifically, the first measured value of Vin_ADC1 is measured/stored after a predefined deactivation time after 354. As can be seen from FIG. 3b, the waveform 360 remains at VDD and the waveform 370 have a voltage V2 at 356. At 358, a second measured value of Vin_ADC1 is stored. The second measured value is measured/stored after a predefined wait time after measuring the first measured value. If there is no fault in the first analog circuit path, the Vin_ADC1 will go back to the previous level (i.e., V1) before the pulldown was enabled. However, as can be seen from FIG. 3b, the waveforms 360 stays at VDD because of the short (i.e., the fault). Whereas, the waveform 370 shows a voltage of V3 at 358 which is very close to the previous level of voltage (i.e., V1) before the pulldown was enabled. Therefore, when the first measured value and the second measured value show similar values, the first fault detection circuit 180 detects a fault in the first analog circuit path. In contrast, when the first measured value and the second measured value show sufficient deviation (e.g., in a predefined range), the first fault detection circuit 180 identifies that there is no fault in the analog circuit path.

Figure 4:
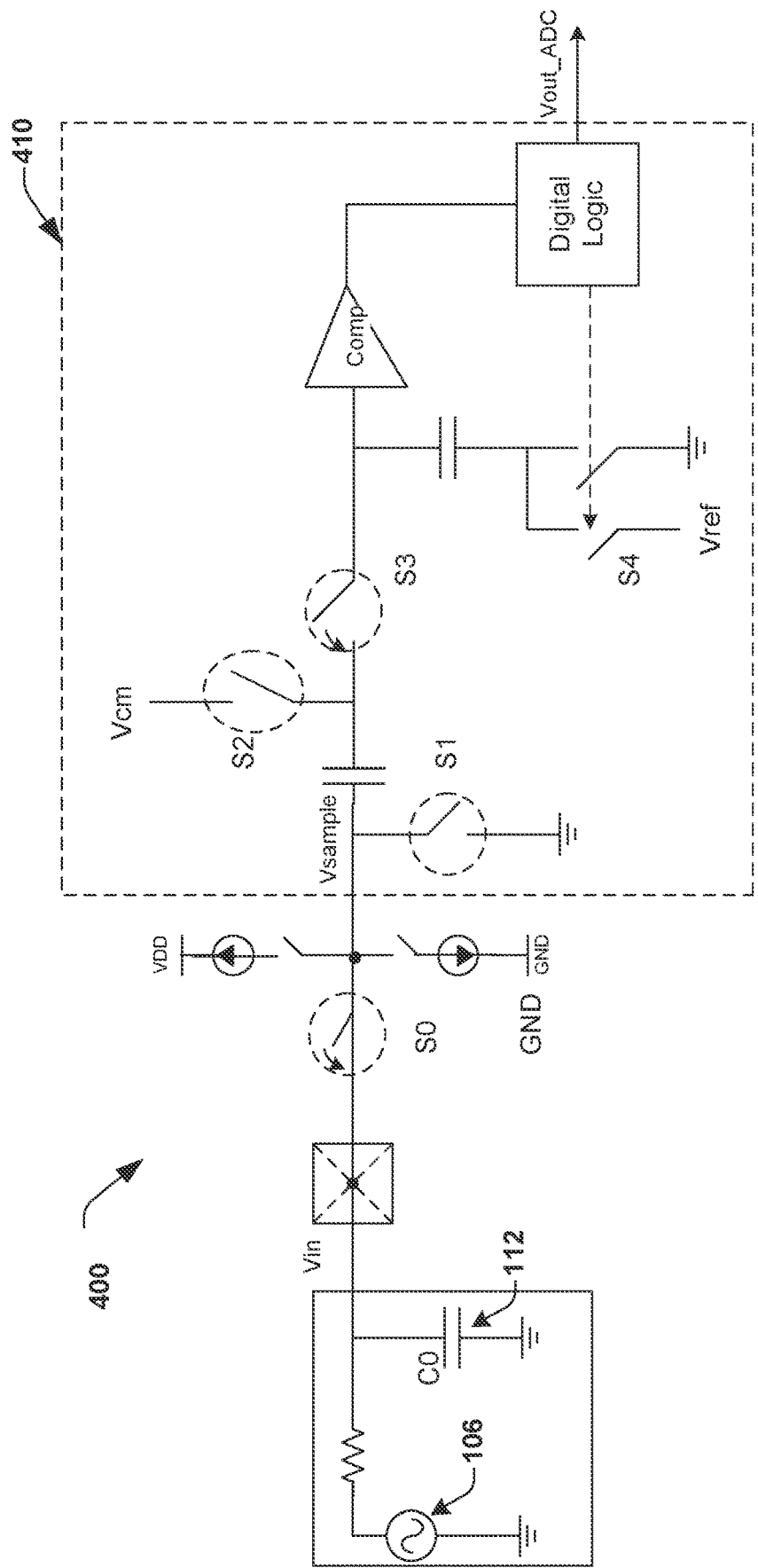
FIG. 4 illustrates one possible implementation of an analog to digital converter (ADC) conversion circuit associated with an analog fault detection system, according to one embodiment of the disclosure.

FIG. 4 illustrates one possible implementation of an analog to digital converter (ADC) conversion circuit 410 associated with an analog fault detection system 400, according to one embodiment of the disclosure. In some embodiments, the ADC conversion circuit 410 corresponds to the first ADC conversion circuit 124 or the second ADC conversion circuit 158 in FIG. 1. In this embodiment, the ADC conversion circuit 410 comprises a successive approximation (SAR) ADC with sample and hold. However, other implementations of the ADC conversion circuit 410 are also contemplated to be within the scope of this disclosure. In some embodiments, the ADC conversion circuit 410 is configured to generate a digital ADC output Vout_ADC (similar to the Vout_ADC2 or Vout_ADC2 in FIG. 1).

Figure 5A:
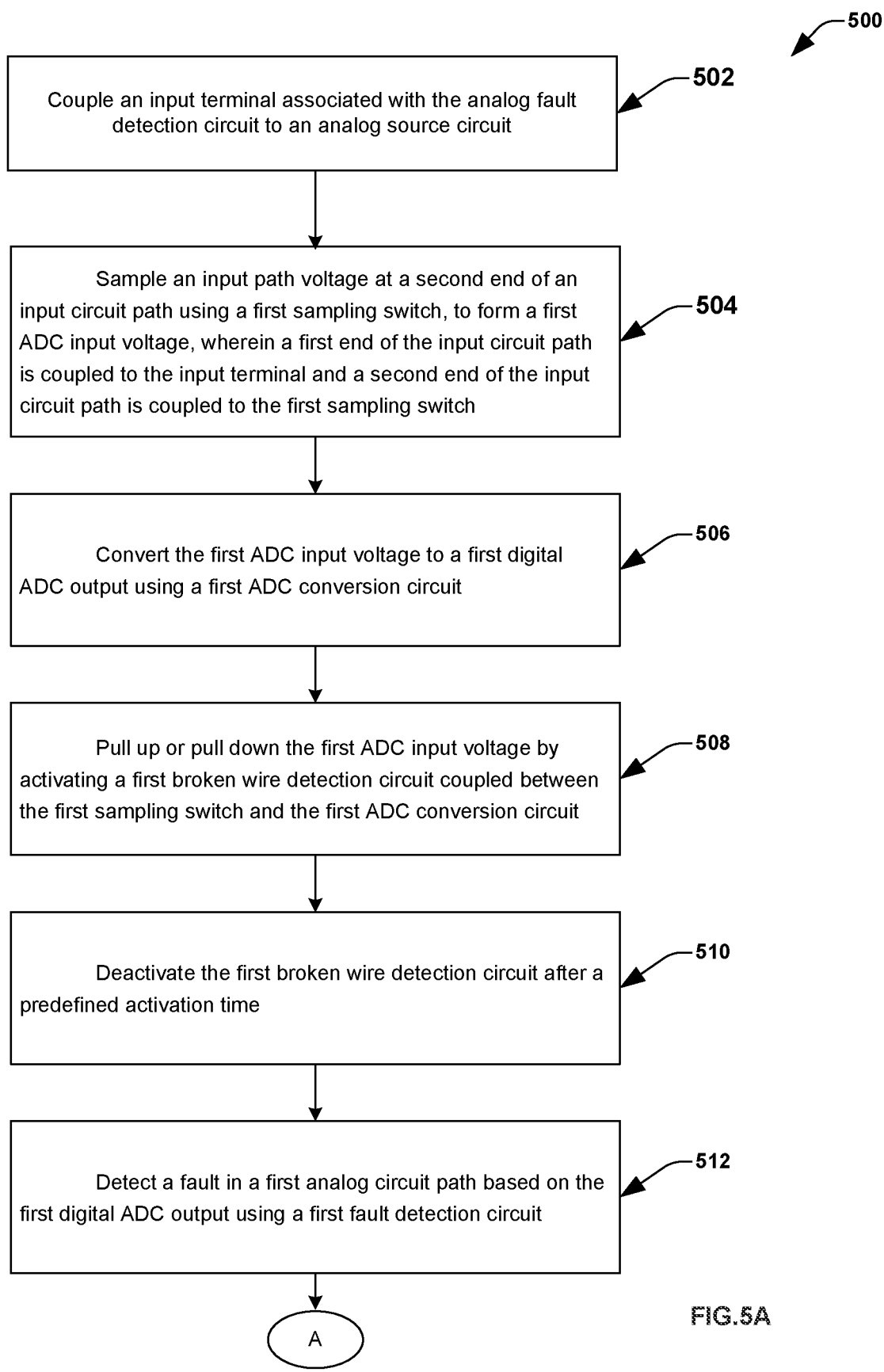
FIGS. 5A-5B illustrate a flowchart of a method of an analog fault detection system, according to one embodiment of the disclosure.
Figure 5B:
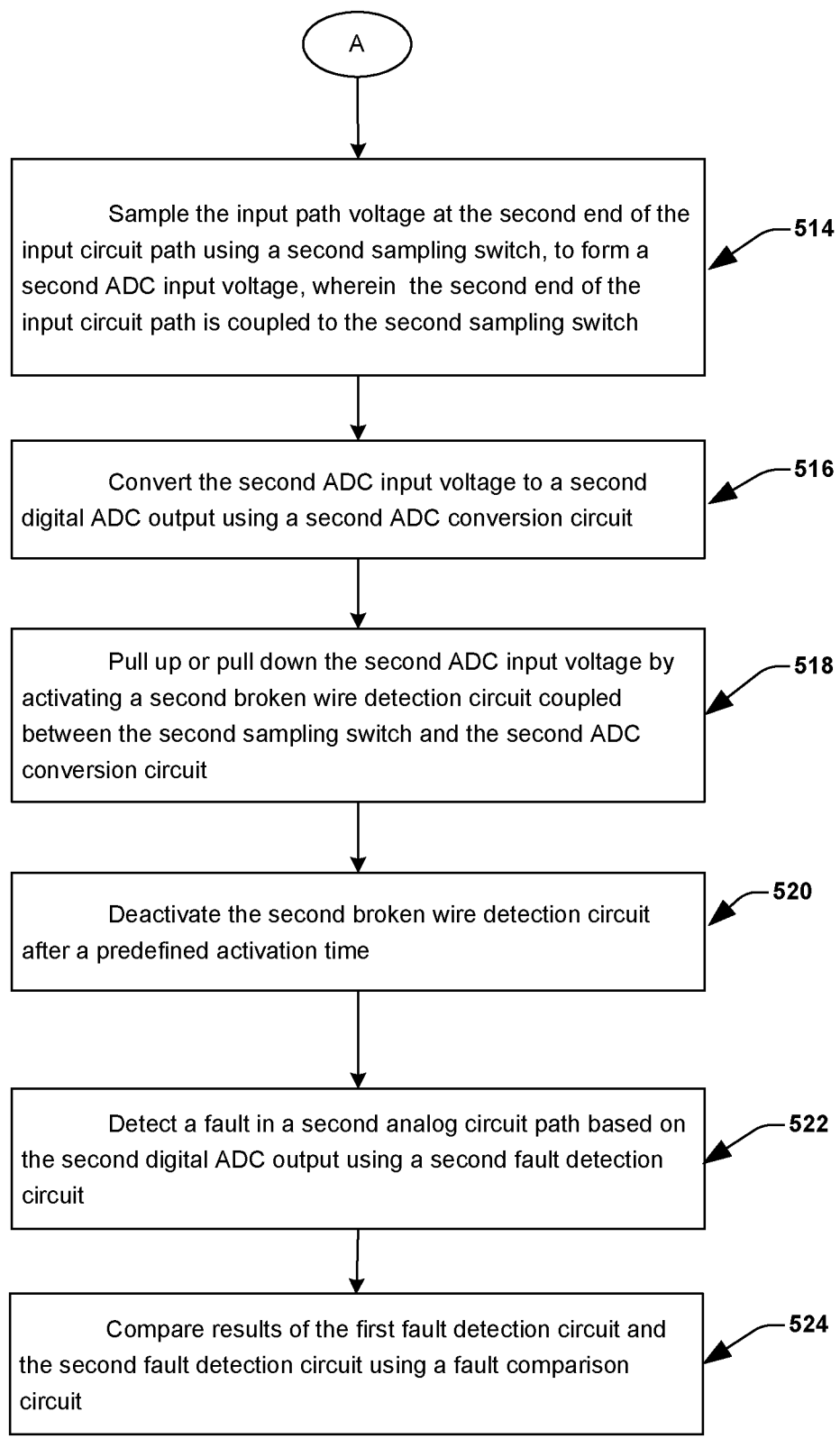

FIGS. 5A-5B illustrate a flowchart of a method 500 of an analog fault detection system, according to one embodiment of the disclosure. The method is explained herein with reference to the analog fault detection system 100 in FIG. 1. At 502, an input terminal (e.g., the input terminal 114 in FIG. 1) associated with an analog fault detection circuit (e.g., the analog fault detection circuit 104 in FIG. 1) is coupled to an analog source circuit (e.g., the analog source circuit 102 in FIG. 1). At 504, an input path voltage (e.g., the input path voltage Vin_path in FIG. 1) at a second end of an input circuit path (e.g., the input circuit path 116 in FIG. 1) is sampled using a first sampling switch (e.g., the first sampling switch 128 in FIG. 1), to form a first ADC input voltage (e.g., the first ADC input voltage Vin_ADC1 in FIG. 1). In some embodiments, a first end of the input circuit path is coupled to the input terminal and a second end of the input circuit path is coupled to the first sampling switch.

At 506, the first ADC input voltage is converted to a first digital ADC output (e.g., the first digital ADC output Vout_ADC1 in FIG. 1) using a first ADC conversion circuit (e.g., the first ADC conversion circuit 124 in FIG. 1). In some embodiments, the first sampling switch is comprised in a first ADC circuit path (e.g., the first ADC circuit path 126 in FIG. 1) coupled between the second end of the input circuit path and the first ADC conversion circuit. At 508, the first ADC input voltage is pulled up or pulled down by activating a first broken wire detection circuit (e.g., the first broken wore detection circuit 138 in FIG. 1) coupled between the first sampling switch and the first ADC conversion circuit. In some embodiments, the first ADC input voltage is pulled up or pulled down in order to detect a fault associated with a first analog circuit path. In some embodiments, the first analog circuit path includes the analog source circuit, the input circuit path and the first ADC circuit path. At 510, the first broken wire detection circuit is deactivated after a predefined activation time. At 512, the fault in the first analog circuit path is detected based on the first digital ADC output using a first fault detection circuit (e.g., the first fault detection circuit 180 in FIG. 1). In some embodiments, the first fault detection circuit is configured to detect the fault based on a comparison of a first measured value of the first digital ADC output and a second measured value of the first digital ADC output, as explained above with respect to FIG. 2.

At 514, the input path voltage at the second end of the input circuit path is sampled using a second sampling switch (e.g., the second sampling switch 162 in FIG. 1), to form a second ADC input voltage (e.g., the second ADC input voltage Vin_ADC2 in FIG. 10. In some embodiments, the second end of the input circuit path is coupled to the second sampling switch. At 516, the second ADC input voltage is converted to a second digital ADC output (e.g., the second digital ADC output Vout_ADC2 in FIG. 1) using a second ADC conversion circuit (e.g., the second ADC conversion circuit 158 in FIG. 1). In some embodiments, the second sampling switch is comprised in a second ADC circuit path (e.g., the second ADC circuit path 160 in FIG. 1) coupled between the second end of the input circuit path and the second ADC conversion circuit. At 518, the second ADC input voltage is pulled up or pulled down by activating a second broken wire detection circuit (e.g., the second broken wire detection circuit 164 in FIG. 1) coupled between the second sampling switch and the second ADC conversion circuit. In some embodiments, the second ADC input voltage is pulled up or pulled down in order to detect a fault associated with a second analog circuit path. In some embodiments, the second analog circuit path includes the analog source circuit, the input circuit path and the second ADC circuit path, as explained above.

At 520, the second broken wire detection circuit is deactivated after a predefined activation time. At 522, the fault in the second analog circuit path is detected based on the second digital ADC output using a second fault detection circuit (e.g., the second fault detection circuit 182 in FIG. 1). In some embodiments, the second fault detection circuit is configured to detect the fault based on a comparison of a first measured value of the second digital ADC output and a second measured value of the second digital ADC output, as explained above with respect to FIG. 2. In some embodiments, the first broken wire detection circuit is activated/deactivated and the second broken wire detection circuit is activated/deactivated simultaneously or at the same time. Alternately, the first broken wire detection circuit is activated/deactivated and the second broken wire detection circuit is activated/deactivated at different time instances. At 524, results of the first fault detection circuit and the second fault detection circuit are compared using a fault comparison circuit (e.g., the fault comparison circuit 184 in FIG. 1).

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an analog fault detection circuit, comprising an input terminal configured to couple to an analog source circuit; an input circuit path having a first end and a second end, and coupled to the input terminal at the first end; and a first analog to digital converter (ADC) circuit comprising a first ADC conversion circuit configured to convert a first ADC input voltage to a first digital ADC output; a first ADC circuit path coupled between the second end of the input circuit path and the first ADC conversion circuit, the first ADC circuit path comprising a first sampling switch, a first terminal of which is coupled to the second end of the input circuit path and wherein the first sampling switch is configured to sample an input path voltage at the second end of the input circuit path to provide the first ADC input voltage at a second terminal of the first sampling switch; and a first broken wire detection circuit coupled between the first sampling switch and the first ADC conversion circuit, and configured to adaptively pulldown or pullup the first ADC input voltage, in order to detect a fault associated with a first analog circuit path, wherein the first analog circuit path includes the analog source circuit, the input circuit path and the first ADC circuit path.

Example 2 is an analog fault detection circuit, including the subject matter of example 1, wherein the first broken wire detection circuit comprises a first pullup circuit branch configured to pullup the first ADC input voltage or a first pulldown circuit branch configured to pulldown the first ADC input voltage, or both.

Example 3 is an analog fault detection circuit, including the subject matter of examples 1-2, including or omitting elements, wherein the first pullup circuit branch comprises a first pullup source circuit coupled to a positive supply voltage at a first end, and a first pullup switch circuit having a first terminal and a second terminal, the first terminal being coupled in series to a second, different end of the first pullup source circuit and the second terminal being coupled to an ADC node in the first ADC circuit path coupled between the first sampling switch and the first ADC conversion circuit.

Example 4 is an analog fault detection circuit, including the subject matter of examples 1-3, including or omitting elements, wherein the first pulldown circuit branch comprises a first pulldown source circuit coupled to a ground circuit at a first end, and a first pulldown switch circuit having a first terminal and a second terminal, the first terminal being coupled in series to a second, different end of the first pulldown source circuit and the second terminal being coupled to the ADC node in the first ADC circuit path coupled between the first sampling switch and the first ADC conversion circuit.

Example 5 is an analog fault detection circuit, including the subject matter of examples 1-4, including or omitting elements, further comprising a first fault detection circuit coupled to an output of the first ADC conversion circuit and configured to detect the fault in the first analog circuit path, based on the first digital ADC output.

Example 6 is an analog fault detection circuit, including the subject matter of examples 1-5, including or omitting elements, wherein, in order to detect the fault in the first analog circuit path, the first broken wire detection circuit is activated to pullup or pull down the first ADC input voltage and subsequently deactivated after a predefined activation time, and wherein the first fault detection circuit is configured to compare a first measured value of the first digital ADC output and a second measured value of the first digital ADC output after the deactivation, wherein the second measured value comprises a value that is measured after a predefined wait time after measuring the first measured value.

Example 7 is an analog fault detection circuit, including the subject matter of examples 1-6, including or omitting elements, further comprising a second ADC circuit comprising a second ADC conversion circuit configured to convert a second ADC input voltage to a second digital ADC output; a second ADC circuit path coupled between the second end of the input circuit path and the second ADC conversion circuit, the second ADC circuit path comprising a second sampling switch, a first terminal of which is coupled to the second end of the input circuit path and wherein the second sampling switch is configured to sample the input path voltage at the second end of the input path to provide the second ADC input voltage at a second terminal of the second sampling switch; and a second broken wire detection circuit coupled between the second sampling switch and the second ADC conversion circuit, and configured to adaptively pulldown or pullup the second ADC input voltage, in order to detect a fault associated with a second analog circuit path, wherein the second analog circuit path includes the analog source circuit, the input circuit path and the second ADC circuit path.

Example 8 is an analog fault detection circuit, including the subject matter of examples 1-7, including or omitting elements, wherein the second broken wire detection circuit comprises a second pullup circuit branch configured to pullup the second ADC input voltage or a second pulldown circuit branch configured to pulldown the second ADC input voltage, or both.

Example 9 is an analog fault detection circuit, including the subject matter of examples 1-8, including or omitting elements, wherein the second pullup circuit branch comprises a second pullup source circuit coupled to a positive supply voltage at a first end, and a second pullup switch circuit having a first terminal and a second terminal, the first terminal being coupled in series to a second, different end of the second pullup source circuit and the second terminal being coupled to an ADC node in the second ADC circuit path coupled between the second sampling switch and the second ADC conversion circuit.

Example 10 is an analog fault detection circuit, including the subject matter of examples 1-9, including or omitting elements, wherein the second pulldown circuit branch comprises a second pulldown source circuit coupled to a ground circuit at a first end, and a second pulldown switch circuit having a first terminal and a second terminal, the first terminal being coupled in series to a second, different end of the second pulldown source circuit and the second terminal being coupled to the ADC node in the second ADC circuit path coupled between the second sampling switch and the second ADC conversion circuit.

Example 11 is an analog fault detection circuit, including the subject matter of examples 1-10, including or omitting elements, further comprising a second fault detection circuit coupled to an output of the second ADC conversion circuit and configured to detect the fault in the second analog circuit path, based on the second digital ADC output.

Example 12 is an analog fault detection circuit, including the subject matter of examples 1-11, including or omitting elements, wherein, in order to detect the fault in the second analog circuit path, the second broken wire detection circuit is activated to pullup or pull down the second ADC input voltage and subsequently deactivated after a predefined activation time, and wherein the second fault detection circuit is configured compare a first measured value of the second digital ADC output and a second measured value of the second digital ADC output after the deactivation, wherein the second measured value comprises a value that is measured after a predefined wait time after measuring the first measured value.

Example 13 is an analog fault detection circuit, including the subject matter of examples 1-12, including or omitting elements, further comprising a fault comparison circuit configured to compare results of the first fault detection circuit and the second fault detection circuit.

Example 14 is an analog fault detection system, comprising an analog source circuit; and an analog fault detection circuit, comprising an input terminal coupled to the analog source circuit; an input circuit path having a first end and a second end, and coupled to the input terminal at the first end; and a first analog to digital converter (ADC) circuit comprising a first ADC conversion circuit configured to convert a first ADC input voltage to a first digital ADC output; a first ADC circuit path coupled between the second end of the input circuit path and the first ADC conversion circuit, the first ADC circuit path comprising a first sampling switch, a first terminal of which is coupled to the second end of the input circuit path and wherein the first sampling switch is configured to sample an input path voltage at the second end of the input path to provide the first ADC input voltage at a second terminal of the first sampling switch; and a first broken wire detection circuit coupled between the first sampling switch and the first ADC conversion circuit, and configured to adaptively pulldown or pullup the first ADC input voltage, in order to detect a fault associated with a first analog circuit path, wherein the first analog circuit path includes the analog source circuit, the input circuit path and the first ADC circuit path.

Example 15 is an analog fault detection system, including the subject matter of example 14, wherein the first broken wire detection circuit comprises a first pullup circuit branch configured to pullup the first ADC input voltage or a first pulldown circuit branch configured to pulldown the first ADC input voltage, or both.

Example 16 is an analog fault detection system, including the subject matter of examples 14-15, including or omitting elements, wherein the first pullup circuit branch comprises first pullup source circuit coupled to a positive supply voltage at a first end, and a first pullup switch circuit having a first terminal and a second terminal, the first terminal being coupled in series to a second, different end of the first pullup source circuit and the second terminal being coupled to an ADC node in the first ADC circuit path coupled between the first sampling switch and the first ADC conversion circuit.

Example 17 is an analog fault detection system, including the subject matter of examples 14-16, including or omitting elements, wherein the first pulldown circuit branch comprises a first pulldown source circuit coupled to a ground circuit at a first end, and a first pulldown switch circuit having a first terminal and a second terminal, the first terminal being coupled in series to a second, different end of the first pulldown source circuit and the second terminal being coupled to the ADC node in the first ADC circuit path coupled between the first sampling switch and the first ADC conversion circuit.

Example 18 is an analog fault detection system, including the subject matter of examples 14-17, including or omitting elements, wherein the analog fault detection circuit further comprises a first fault detection circuit coupled to an output of the first ADC conversion circuit and configured to detect the fault in the first analog circuit path, based on the first digital ADC output.

Example 19 is an analog fault detection system, including the subject matter of examples 14-18, including or omitting elements, wherein the analog fault detection circuit further comprises a second ADC circuit comprising a second ADC conversion circuit configured to convert a second ADC input voltage to a second digital ADC output; a second ADC circuit path coupled between the second end of the input circuit path and the second ADC conversion circuit, the second ADC circuit path comprising a second sampling switch, a first terminal of which is coupled to the second end of the input circuit path and wherein the second sampling switch is configured to sample the input path voltage at the second end of the input path to provide the second ADC input voltage at a second terminal of the second sampling switch; and a second broken wire detection circuit coupled between the second sampling switch and the second ADC conversion circuit, and configured to adaptively pulldown or pullup the second ADC input voltage, in order to detect a fault associated with a second analog circuit path, wherein the second analog circuit path includes the analog source circuit, the input circuit path and the second ADC circuit path.

Example 20 is an analog fault detection system, including the subject matter of examples 14-19, including or omitting elements, wherein the second broken wire detection circuit comprises a second pullup circuit branch configured to pullup the second ADC input voltage or a second pulldown circuit branch configured to pulldown the second ADC input voltage, or both.

Example 21 is an analog fault detection system, including the subject matter of examples 14-20, including or omitting elements, wherein the second pullup circuit branch comprises a second pullup source circuit coupled to a positive supply voltage at a first end, and a second pullup switch circuit having a first terminal and a second terminal, the first terminal being coupled in series to a second, different end of the second pullup source circuit and the second terminal being coupled to an ADC node in the second ADC circuit path coupled between the second sampling switch and the second ADC conversion circuit.

Example 22 is an analog fault detection system, including the subject matter of examples 14-21, including or omitting elements, wherein the second pulldown circuit branch comprises a second pulldown source circuit coupled to a ground circuit at a first end, and a second pulldown switch circuit having a first terminal and a second terminal, the first terminal being coupled in series to a second, different end of the second pulldown source circuit and the second terminal being coupled to the ADC node in the second ADC circuit path coupled between the second sampling switch and the second ADC conversion circuit.

Example 23 is an analog fault detection system, including the subject matter of examples 14-22, including or omitting elements, wherein the analog fault detection circuit further comprises a second fault detection circuit coupled to an output of the second ADC conversion circuit and configured to detect the fault in the second analog circuit path, based on the second digital ADC output.

Example 24 is an analog fault detection system, including the subject matter of examples 14-23, including or omitting elements, wherein the analog fault detection circuit further comprises a fault comparison circuit configured to compare results of the first fault detection circuit and the second fault detection circuit.

Example 25 is a method for an analog fault detection circuit, comprising coupling an input terminal associated with the analog fault detection circuit to an analog source circuit; converting a first analog to digital converter (ADC) input voltage to a first digital ADC output using a first ADC conversion circuit; sampling an input path voltage at a second end of an input circuit path using a first sampling switch, to form the first ADC input voltage, wherein a first end of the input circuit path is coupled to the input terminal and the second end of the input circuit path is coupled to the first sampling switch, and wherein the first sampling switch is comprised in a first ADC circuit path coupled between the second end of the input circuit path and the first ADC conversion circuit; and adaptively pulling up or pulling down the first ADC input voltage using a first broken wire detection circuit coupled between the first sampling switch and the first ADC conversion circuit, in order to detect a fault associated with a first analog circuit path, wherein the first analog circuit path includes the analog source circuit, the input circuit path and the first ADC circuit path.

Example 26 is a method, including the subject matter of example 25, wherein the first broken wire detection circuit comprises a first pullup circuit branch configured to pullup the first ADC input voltage or a first pulldown circuit branch configured to pulldown the first ADC input voltage, or both.

Example 27 is a method, including the subject matter of examples 25-26, including or omitting elements, wherein the first pullup circuit branch comprises first pullup source circuit coupled to a positive supply voltage at a first end, and a first pullup switch circuit having a first terminal and a second terminal, the first terminal being coupled in series to a second, different end of the first pullup source circuit and the second terminal being coupled to an ADC node in the first ADC circuit path coupled between the first sampling switch and the first ADC conversion circuit.

Example 28 is a method, including the subject matter of examples 25-27, including or omitting elements, wherein the first pulldown circuit branch comprises a first pulldown source circuit coupled to a ground circuit at a first end, and a first pulldown switch circuit having a first terminal and a second terminal, the first terminal being coupled in series to a second, different end of the first pulldown source circuit and the second terminal being coupled to the ADC node in the first ADC circuit path coupled between the first sampling switch and the first ADC conversion circuit.

Example 29 is a method, including the subject matter of examples 25-28, including or omitting elements, wherein the first broken wire detection circuit is activated to pullup or pull down the first ADC input voltage and wherein the method further comprises subsequently deactivating the first broken wire detection circuit after a predefined activation time, in order to detect the fault associated with the first analog circuit path.

Example 30 is a method, including the subject matter of examples 25-29, including or omitting elements, further comprising detecting the fault in the first analog circuit path, using a first fault detection circuit coupled to an output of the first ADC conversion circuit, based on the first digital ADC output after the deactivation of the first broken wire detection circuit.

Example 31 is a method, including the subject matter of examples 25-30, including or omitting elements, wherein detecting the fault in the first analog circuit path using the first fault detection circuit comprises comparing a first measured value of the first digital ADC output and a second measured value of the first digital ADC output after the deactivation of the first broken wire detection circuit, using the first fault detection circuit, wherein the second measured value comprises a value that is measured after a predefined wait time after measuring the first measured value.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

What is claimed is:

1. An analog fault detection circuit, comprising:
an input terminal configured to couple to an analog source circuit;
an input circuit path having a first end and a second end, and coupled to the input terminal at the first end; and
a first analog to digital converter (ADC) circuit comprising:
a first ADC conversion circuit configured to convert a first ADC input voltage to a first digital ADC output;
a first ADC circuit path coupled between the second end of the input circuit path and the first ADC conversion circuit, the first ADC circuit path comprising a first sampling switch, a first terminal of the first sampling switch is coupled to the second end of the input circuit path and wherein the first sampling switch is configured to sample an input path voltage at the second end of the input circuit path to provide the first ADC input voltage at a second terminal of the first sampling switch; and
a first broken wire detection circuit coupled between the first sampling switch and the first ADC conversion circuit, and configured to adaptively pulldown or pullup the first ADC input voltage, in order to detect a fault associated with a first analog circuit path, wherein the first analog circuit path includes the input circuit path and the first ADC circuit path;
a second ADC circuit comprising:
a second ADC conversion circuit configured to convert a second ADC input voltage to a second digital ADC output;
a second ADC circuit path coupled between the second end of the input circuit path and the second ADC conversion circuit, the second ADC circuit path comprising a second sampling switch, a first terminal of the second sampling switch is coupled to the second end of the input circuit path and wherein the second sampling switch is configured to sample the input path voltage at the second end of the input circuit path to provide the second ADC input voltage at a second terminal of the second sampling switch; and
a second broken wire detection circuit coupled between the second sampling switch and the second ADC conversion circuit, and configured to adaptively pulldown or pullup the second ADC input voltage, in order to detect a fault associated with a second analog circuit path, wherein the second analog circuit path includes the input circuit path and the second ADC circuit path.

2. The analog fault detection circuit of claim 1, wherein the first broken wire detection circuit comprises a first pullup circuit branch configured to pullup the first ADC input voltage or a first pulldown circuit branch configured to pulldown the first ADC input voltage, or both.

3. The analog fault detection circuit of claim 2, wherein the first pullup circuit branch comprises a first pullup source circuit coupled to a positive supply voltage at a first end of the first pullup circuit branch, and a first pullup switch circuit having a first terminal and a second terminal, the first terminal of the first pullup switch circuit being coupled in series to a second, different end of the first pullup source circuit and the second terminal of the first pullup switch circuit being coupled to a first ADC node in the first ADC circuit path coupled between the first sampling switch and the first ADC conversion circuit.

4. The analog fault detection circuit of claim 3, wherein the first pulldown circuit branch comprises a first pulldown source circuit coupled to a ground circuit at a first end of the first pulldown circuit branch, and a first pulldown switch circuit having a first terminal and a second terminal, the first terminal of the first pulldown switch circuit being coupled in series to a second, different end of the first pulldown source circuit and the second terminal of the first pulldown switch circuit being coupled to the ADC node in the first ADC circuit path coupled between the first sampling switch and the first ADC conversion circuit.

5. The analog fault detection circuit of claim 3, wherein the second broken wire detection circuit comprises a second pullup circuit branch configured to pullup the second ADC input voltage or a second pulldown circuit branch configured to pulldown the second ADC input voltage, or both.

6. The analog fault detection circuit of claim 5, wherein the second pullup circuit branch comprises a second pullup source circuit coupled to a positive supply voltage at a first end of the second pullup circuit branch, and a second pullup switch circuit having a first terminal and a second terminal, the first terminal of the second pullup switch circuit being coupled in series to a second, different end of the second pullup source circuit and the second terminal of the second pullup switch circuit being coupled to a second ADC node in the second ADC circuit path coupled between the second sampling switch and the second ADC conversion circuit.

7. The analog fault detection circuit of claim 5, wherein the second pulldown circuit branch comprises a second pulldown source circuit coupled to a ground circuit at a first end, and a second pulldown switch circuit having a first terminal and a second terminal, the first terminal being coupled in series to a second, different end of the second pulldown source circuit and the second terminal being coupled to the ADC node in the second ADC circuit path coupled between the second sampling switch and the second ADC conversion circuit.

8. The analog fault detection circuit of claim 1, further comprising a first fault detection circuit coupled to an output of the first ADC conversion circuit and configured to detect the fault in the first analog circuit path, based on the first digital ADC output.

9. The analog fault detection circuit of claim 8, wherein, in order to detect the fault in the first analog circuit path, the first broken wire detection circuit is activated to pullup or pull down the first ADC input voltage and subsequently deactivated after a predefined activation time, and wherein the first fault detection circuit is configured to compare a first measured value of the first digital ADC output and a second measured value of the first digital ADC output after the deactivation, wherein the second measured value comprises a value that is measured after a predefined wait time after measuring the first measured value.

10. The analog fault detection circuit of claim 8, further comprising a second fault detection circuit coupled to an output of the second ADC conversion circuit and configured to detect the fault in the second analog circuit path, based on the second digital ADC output.

11. The analog fault detection circuit of claim 10, wherein, in order to detect the fault in the second analog circuit path, the second broken wire detection circuit is activated to pullup or pull down the second ADC input voltage and subsequently deactivated after a predefined activation time, and wherein the second fault detection circuit is configured compare a first measured value of the second digital ADC output and a second measured value of the second digital ADC output after the deactivation, wherein the second measured value comprises a value that is measured after a predefined wait time after measuring the first measured value.

12. The analog fault detection circuit of claim 10, further comprising a fault comparison circuit configured to compare results of the first fault detection circuit and the second fault detection circuit.

13. An analog fault detection system, comprising:
an analog source circuit; and
an analog fault detection circuit, comprising:
  an input terminal coupled to the analog source circuit;
  an input circuit path having a first end and a second end, and coupled to the input terminal at the first end; and
  a first analog to digital converter (ADC) circuit comprising:
    a first ADC conversion circuit;
    a first ADC circuit path coupled between the second end of the input circuit path and the first ADC conversion circuit, the first ADC circuit path comprising a first sampling switch, a first terminal of the first sampling switch is coupled to the second end of the input circuit path; and
    a first broken wire detection circuit coupled between the first sampling switch and the first ADC conversion circuit; and
  a second ADC circuit comprising:
    a second ADC conversion circuit;
    a second ADC circuit path coupled between the second end of the input circuit path and the second ADC conversion circuit, the second ADC circuit path comprising a second sampling switch, a first terminal of the second sampling switch is coupled to the second end of the input circuit path; and
    a second broken wire detection circuit coupled between the second sampling switch and the second ADC conversion circuit.

14. The analog fault detection system of claim 13, wherein the first broken wire detection circuit comprises a first pullup circuit branch comprising first pullup source circuit coupled to a positive supply voltage at a first end of the first pullup circuit branch, and a first pullup switch circuit having a first terminal and a second terminal, the first terminal of the first pullup switch circuit being coupled in series to a second, different end of the first pullup source circuit and the second terminal of the first pullup switch circuit being coupled to a first ADC node in the first ADC circuit path coupled between the first sampling switch and the first ADC conversion circuit.

15. The analog fault detection system of claim 14, wherein the first broken wire detection circuit comprises a first pulldown circuit branch wherein the first pulldown circuit branch comprises a first pulldown source circuit coupled to a ground circuit at a first end of the first pulldown circuit branch, and a first pulldown switch circuit having a first terminal and a second terminal, the first terminal of the first pulldown switch circuit being coupled in series to a second, different end of the first pulldown source circuit and the second terminal of the first pulldown switch circuit being coupled to the first ADC node in the first ADC circuit path coupled between the first sampling switch and the first ADC conversion circuit.

16. The analog fault detection system of claim 15, wherein the analog fault detection circuit further comprises a first fault detection circuit coupled to an output of the first ADC conversion circuit.

17. The analog fault detection system of claim 16, wherein the second broken wire detection circuit comprises a second pulldown circuit branch wherein the second pulldown circuit branch comprises a second pulldown source circuit coupled to the ground circuit at a first end of the second pulldown circuit branch, and a second pulldown switch circuit having a first terminal and a second terminal, the first terminal of the second pulldown switch circuit being coupled in series to a second, different end of the second pulldown source circuit and the second terminal of the second pulldown switch circuit being coupled to a second ADC node in the second ADC circuit path coupled between the second sampling switch and the second ADC conversion circuit.

18. The analog fault detection system of claim 16, wherein the analog fault detection circuit further comprises a second fault detection circuit coupled to an output of the second ADC conversion circuit.

19. The analog fault detection system of claim 18, wherein the analog fault detection circuit further comprises a fault comparison circuit coupled to the first fault detection circuit and the second fault detection circuit.

20. An analog fault detection circuit, comprising:
an input circuit path having a first end and a second end, the first end configured to receive an analog signal;
a first analog to digital converter (ADC) and fault detection path branching from the second end of the input circuit path, the first ADC and fault detection path comprising:
  a first broken wire detection circuit coupled to the second end of the input circuit path;
  a first ADC conversion circuit coupled to the first broken wire detection circuit and arranged downstream of the first broken wire detection circuit on the first ADC and fault detection path; and
  a first fault detection circuit coupled to the first ADC conversion circuit and arranged downstream of the first ADC conversion circuit on the first ADC and fault detection path;
a second ADC and fault detection path branching from the second end of the input circuit path, the second ADC and fault detection path comprising:
  a second broken wire detection circuit coupled to the second end of the input circuit path;
  a second ADC conversion circuit coupled to the second broken wire detection circuit and downstream of the second broken wire detection circuit on the second ADC and fault detection path; and
  a second fault detection circuit coupled to the second ADC conversion circuit and downstream of the second ADC conversion circuit on the second ADC and fault detection path; and
a fault comparison circuit having a first input coupled to an output of the first fault detection circuit and having a second input coupled to an output of the second fault detection circuit.

* * * * *